(12) United States Patent
Kim et al.

(10) Patent No.: US 10,942,447 B2
(45) Date of Patent: Mar. 9, 2021

(54) FILM FRAME, DISPLAY SUBSTRATE-MANUFACTURING SYSTEM, AND DISPLAY SUBSTRATE-MANUFACTURING METHOD

(71) Applicant: SAMSUNG ELECTRONICS CO., LTD., Suwon-si (KR)

(72) Inventors: Dong-wook Kim, Seoul (KR); Ju-hyun Lee, Suwon-si (KR); Byeong-sang Kim, Hwaseong-si (KR); Kyung-bin Park, Seoul (KR); Ki-ju Sohn, Gunpo-si (KR); Ho Yu, Pohang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 278 days.

(21) Appl. No.: 15/869,976

(22) Filed: Jan. 12, 2018

(65) Prior Publication Data
US 2019/0049837 A1 Feb. 14, 2019

(30) Foreign Application Priority Data
Aug. 11, 2017 (KR) .......................... 10-2017-0102561

(51) Int. Cl.
*G03F 7/00* (2006.01)
(52) U.S. Cl.
CPC .................................. *G03F 7/0002* (2013.01)
(58) Field of Classification Search
CPC ................................................... G03F 7/0002
See application file for complete search history.

(56) References Cited

U.S. PATENT DOCUMENTS

| | | | | |
|---|---|---|---|---|
| 4,038,920 A | * | 8/1977 | Crowley | B41F 15/0818 101/123 |
| 4,253,875 A | * | 3/1981 | Heymann | H05K 3/182 106/1.26 |
| 4,394,094 A | * | 7/1983 | Simning | G03D 15/10 101/35 |
| 4,415,282 A | * | 11/1983 | Euteneuer | G03D 15/10 101/35 |

(Continued)

FOREIGN PATENT DOCUMENTS

| | | |
|---|---|---|
| KR | 10-0892088 B1 | 3/2009 |
| KR | 10-1040353 B1 | 6/2011 |

(Continued)

*Primary Examiner* — Leith S Shafi
*Assistant Examiner* — Nicholas R Krasnow
(74) *Attorney, Agent, or Firm* — Lee IP Law, P.C.

(57) ABSTRACT

A film frame, a system for manufacturing a display substrate, and a method of manufacturing a display substrate, the film frame including a pair of frame edges extending lengthwise in a first direction and arranged opposite to each other; a fixed end clamp connected to the pair of frame edges and extending lengthwise in a second direction perpendicular to the first direction; and a free end clamp between the pair of frame edges, the free end clamp extending lengthwise in the second direction and configured to be detachably coupled with the pair of frame edges, wherein the fixed end clamp includes a first magnetic fixer extending lengthwise in the second direction and a second magnetic fixer on the first magnetic fixer, and the free end clamp includes a third magnetic fixer extending lengthwise in the second direction and a fourth magnetic fixer on the third magnetic fixer.

17 Claims, 13 Drawing Sheets

(56) References Cited

U.S. PATENT DOCUMENTS

| | | | | | |
|---|---|---|---|---|---|
| 4,529,477 | A | * | 7/1985 | Lundberg | H05K 3/0094 216/17 |
| 4,555,745 | A | * | 11/1985 | Westermeir | H01G 4/20 361/320 |
| 4,785,333 | A | * | 11/1988 | Okano | G03B 27/475 355/39 |
| 5,463,948 | A | * | 11/1995 | Newman | B41F 15/0877 101/127.1 |
| 5,534,969 | A | * | 7/1996 | Miyake | G03F 7/707 250/559.3 |
| 5,765,476 | A | * | 6/1998 | McKeever | B41F 15/36 101/127.1 |
| 5,875,949 | A | * | 3/1999 | Hevenor | B65H 29/00 226/102 |
| 5,895,006 | A | * | 4/1999 | Karaki | B26D 3/10 242/525.4 |
| 5,957,048 | A | * | 9/1999 | Newman, Jr. | B41F 27/1268 101/127.1 |
| 6,578,304 | B1 | * | 6/2003 | Lytle | G09F 7/04 40/124.04 |
| 9,328,407 | B2 | * | 5/2016 | Lee | C23C 14/042 |
| 9,442,370 | B2 | | 9/2016 | Sato et al. | |
| 9,500,962 | B2 | * | 11/2016 | Kim | B05B 12/20 |
| 9,740,112 | B2 | * | 8/2017 | Sinharoy | G03F 7/707 |
| 10,580,683 | B2 | * | 3/2020 | Su | C23C 16/042 |
| 2002/0112622 | A1 | * | 8/2002 | Rosenberg | B41F 15/36 101/127.1 |
| 2003/0127370 | A1 | * | 7/2003 | Miles | B03C 1/22 209/215 |
| 2003/0168112 | A1 | * | 9/2003 | Wygnanski | H01H 51/2254 137/625.44 |
| 2003/0230665 | A1 | * | 12/2003 | Small | B65H 16/005 242/559 |
| 2004/0046863 | A1 | * | 3/2004 | Leppanen | B41J 11/06 347/264 |
| 2004/0216345 | A1 | * | 11/2004 | Wadusky | A47G 1/215 40/768 |
| 2005/0263017 | A1 | * | 12/2005 | Chen | B41F 15/0818 101/126 |
| 2008/0216953 | A1 | * | 9/2008 | Tirlemont | B29C 45/1418 156/285 |
| 2009/0100732 | A1 | * | 4/2009 | Seidler | A47G 1/065 40/729 |
| 2009/0129897 | A1 | * | 5/2009 | Babbs | H01L 21/67213 414/217 |
| 2012/0086142 | A1 | * | 4/2012 | Terada | H01L 21/67745 264/39 |
| 2015/0107141 | A1 | * | 4/2015 | Ryan | A47G 1/06 40/711 |
| 2015/0251348 | A1 | | 9/2015 | Usui | |
| 2016/0053137 | A1 | * | 2/2016 | Hayashishita | C09J 7/20 438/464 |
| 2016/0136872 | A1 | | 5/2016 | Yanagisawa | |
| 2016/0186317 | A1 | * | 6/2016 | Han | C23C 14/042 29/464 |
| 2017/0120501 | A1 | * | 5/2017 | Jeon | B29C 51/421 |

FOREIGN PATENT DOCUMENTS

| | | |
|---|---|---|
| KR | 10-1087975 B1 | 11/2011 |
| KR | 10-2012-0048394 A | 5/2012 |
| KR | 10-2012-0109878 A | 10/2012 |
| KR | 10-1615581 B1 | 4/2016 |
| KR | 10-2017-0062426 A | 6/2017 |

* cited by examiner

| A | B | A | B | A |
|---|---|---|---|---|
| B | A | B | A | B |

| A | A | A | A | A |
|---|---|---|---|---|
| B | B | B | B | B |

211"/221"/231"/241"

US 10,942,447 B2

FILM FRAME, DISPLAY SUBSTRATE-MANUFACTURING SYSTEM, AND DISPLAY SUBSTRATE-MANUFACTURING METHOD

CROSS-REFERENCE TO RELATED APPLICATION

Korean Patent Application No. 10-2017-0102561, filed on Aug. 11, 2017, in the Korean Intellectual Property Office, and entitled: "Film Frame, Display Substrate-Manufacturing System, and Display Substrate-Manufacturing Method," is incorporated by reference herein in its entirety.

BACKGROUND

1. Field

Embodiments relate to a film frame and a method and system for manufacturing a display substrate.

2. Description of the Related Art

Imprint technology is one of the lithography technologies for manufacturing semiconductor devices. According to imprint technology, an uneven pattern may be formed on a substrate, such as a silicon substrate or a glass substrate, by using a mold (e.g., an imprint film) where a fine uneven pattern is formed as an original plate.

SUMMARY

The embodiments may be realized by providing a film frame configured to be loaded with an imprint film, the film frame including a pair of frame edges extending lengthwise in a first direction and arranged opposite to each other; a fixed end clamp connected to the pair of frame edges and extending lengthwise in a second direction perpendicular to the first direction; and a free end clamp between the pair of frame edges, the free end clamp extending lengthwise in the second direction and configured to be detachably coupled with the pair of frame edges, wherein the fixed end clamp includes a first magnetic fixer extending lengthwise in the second direction and a second magnetic fixer on the first magnetic fixer, and the free end clamp includes a third magnetic fixer extending lengthwise in the second direction and a fourth magnetic fixer on the third magnetic fixer.

The embodiments may be realized by providing a system for manufacturing a display substrate, the system including a film loading stage; a film frame configured to be loaded with an imprint film at the film loading stage; an imprint stage configured to perform an imprinting process on the display substrate by using the imprint film; and a transporter configured to move the film frame between the film loading stage and the imprint stage, wherein the film loading stage includes a flat film loading chuck having at least two pairs of opposite edges; and an adhesive roll and a mold adjacent to first edges which are one pair of the at least two pairs of opposite edges of the film loading chuck.

The embodiments may be realized by providing a method of manufacturing a display substrate, the method including providing a film frame to a film loading stage; providing an imprint film to the film loading stage; aligning the imprint film with the film frame; fixing the imprint film to the film frame; and imprinting the imprint film on the display substrate, wherein providing the imprint film includes separating a protection film from the imprint film by using an elastic force.

BRIEF DESCRIPTION OF THE DRAWINGS

Features will be apparent to those of ordinary skill in the art by describing in detail exemplary embodiments with reference to the attached drawings in which:

FIGS. 7A to 7C illustrate cross-sectional views of a film frame according to some embodiments;

DETAILED DESCRIPTION

Figure 1:
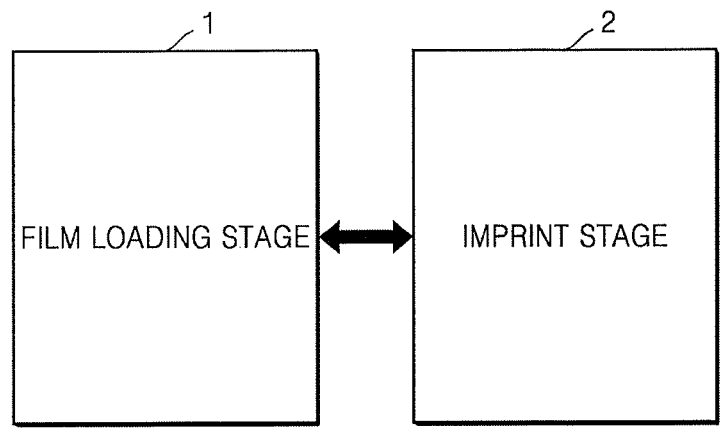
FIG. 1 illustrates a block diagram of a system for manufacturing a display substrate, according to some embodiments.

FIG. 1 illustrates a block diagram of a system 1000 for manufacturing a display substrate, according to some embodiments.

Referring to FIG. 1, the system 1000 may include a film loading stage 1 and an imprint stage 2. In an implementation, the system 1000 may further include a film frame 200 (refer to FIG. 5A) where an imprint film IF (refer to FIG. 3A) is loaded. The imprint film IF (refer to FIG. 3A) may be loaded on the film frame 200 (refer to FIG. 5A) at the film loading stage 1. The film frame 200 (refer to FIG. 5A) loaded with the imprint film IF (refer to FIG. 3A) may move to the imprint stage 2 to perform an imprinting process on a display substrate.

The imprinting process is a process of transferring an uneven pattern of a mold (e.g., an imprint film) to a substrate, etc. The substrate may be coated with a photo-curable chemical liquid layer (e.g., an ultraviolet curable material), and an uneven pattern may be formed on the chemical liquid layer by using the mold. The chemical liquid layer may be cured by irradiating light (e.g., ultraviolet rays) to the chemical liquid layer in which the uneven pattern is formed, and then, the mold may be separated from the cured chemical liquid layer.

Figure 2:
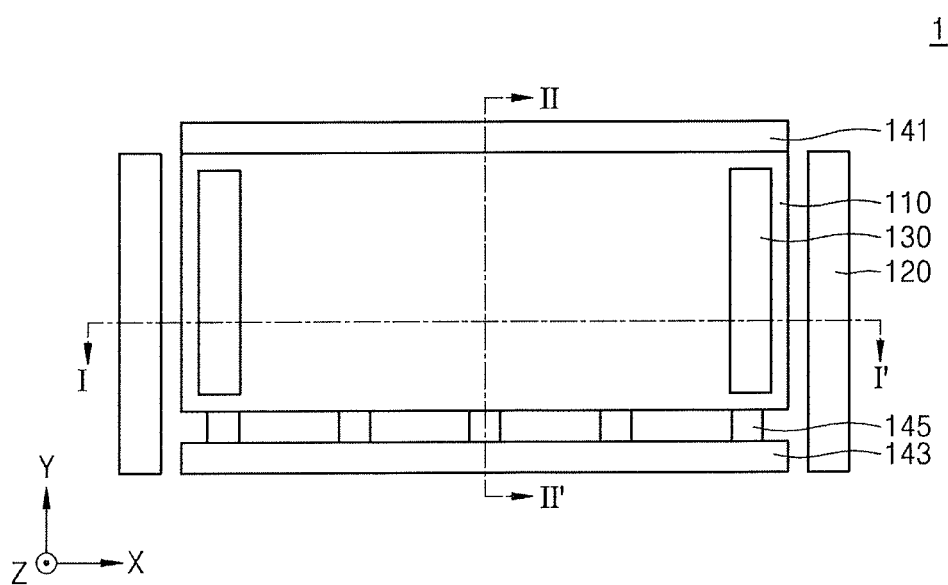
FIG. 2 illustrates a plan view of a film loading stage according to some embodiments.
Figure 3A:
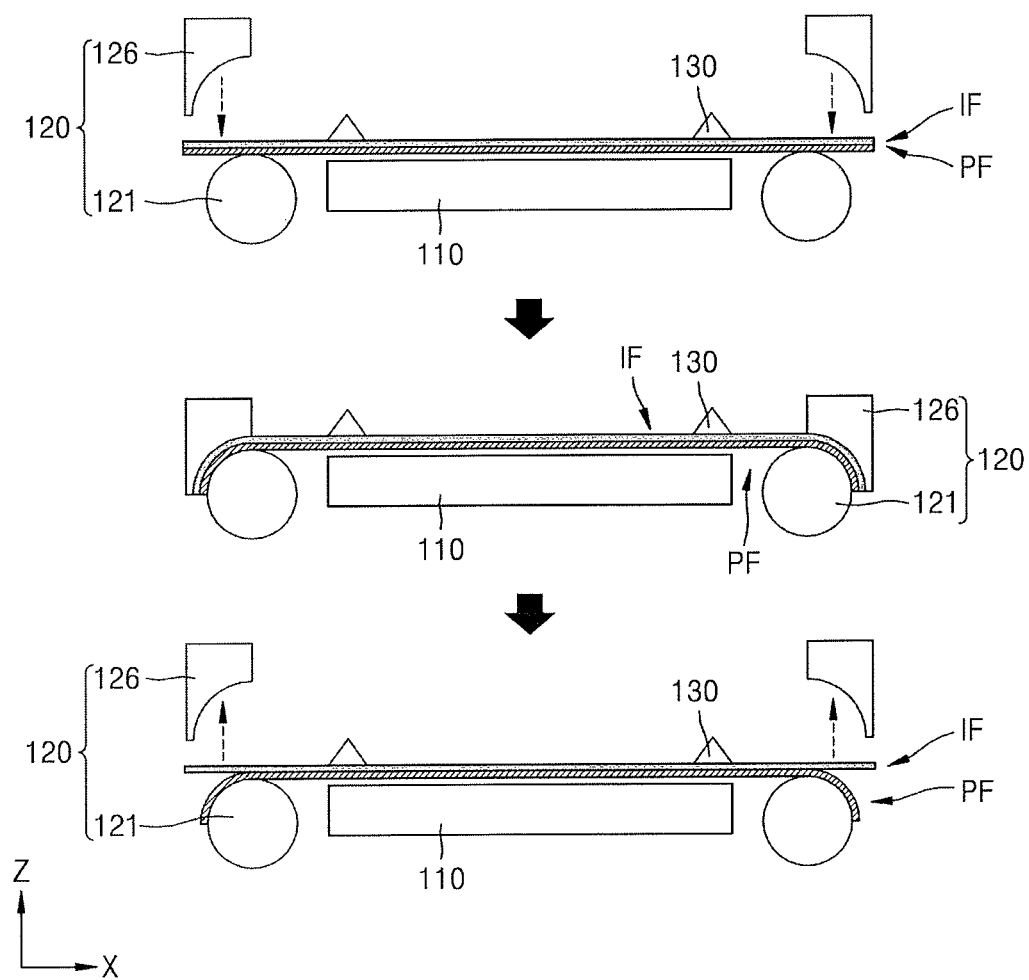
FIGS. 3A and 3B illustrate cross-sectional views taken along a line I-I' of FIG. 2.
Figure 3B:
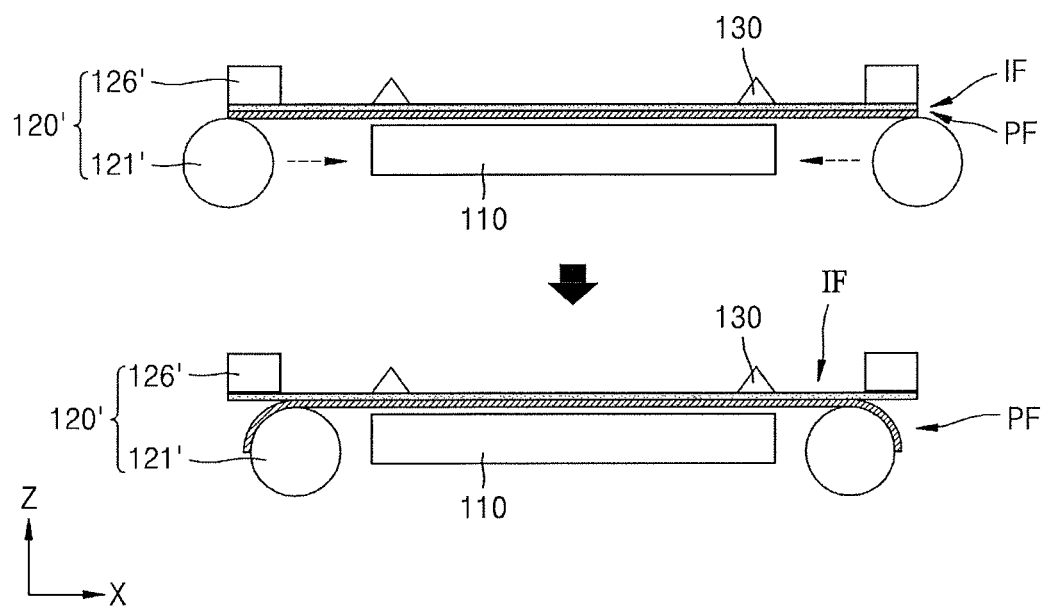
Figure 4:
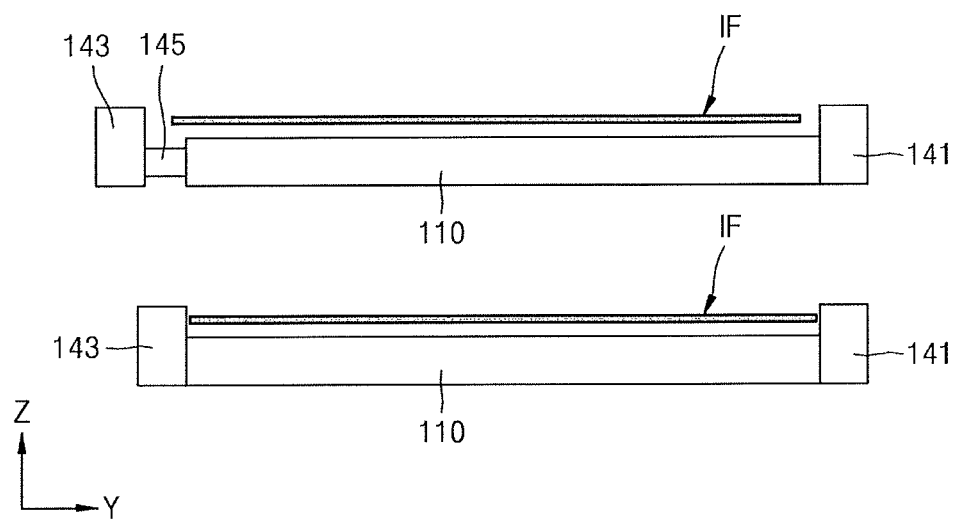
FIG. 4 illustrates a cross-sectional view taken along a line II-II' of FIG. 2.

FIG. 2 illustrates a plan view of the film loading stage 1 according to some embodiments. FIGS. 3A and 3B illustrate cross-sectional views taken along a line I-I' of FIG. 2. FIG. 4 illustrates a cross-sectional view taken along a line II-II' of FIG. 2.

Unlike FIG. 2, FIGS. 3A, 3B, and 4 show the imprint film IF and a protection film PF additionally provided on the film loading stage 1 for understanding of some embodiments.

Referring to FIG. 2, the film loading stage 1 may include a film loading chuck 110, a protection film separator 120, a film fixer 130, a reference end 141, an aligner 143, and an alignment ruler driver 145.

The film loading chuck 110 may be a flat chuck configured to support the imprint film IF (refer to FIG. 3A) while the imprint film IF (refer to FIG. 3A) is loaded onto the film frame 200 (refer to FIG. 5A) as described below. The film loading chuck 110 may include at least two pairs of opposite edges. The film loading chuck 110 may extend in two directions substantially perpendicular to each other so as to have a substantially rectangular flat form, and in the present specification, the two directions will be respectively referred to as first and second directions X and Y. Also, a direction substantially vertical to an upper surface of the film loading chuck 110 will be referred to as a third direction Z. A direction denoted by an arrow in the drawings and an opposite direction thereof will be referred to as the same direction. In an implementation, the film loading stage 1 may be disposed such that an upper surface of the film loading chuck 110 is parallel to the ground. In an implementation, as illustrated in FIG. 2, a length of the film loading chuck 110 in the first direction X may be greater than a length thereof in the second direction Y. In an implementation, the length of the film loading chuck 110 in the first direction X may be the same as or less than the length thereof in the second direction Y.

The protection film separator 120 may be disposed adjacent to two edges of the film loading chuck 110 in the second direction Y or the first direction X. As described below, the protection film separator 120 may be configured to separate the protection film PF from a process surface of the imprint film IF. The process surface of the imprint film IF is a surface including an uneven pattern previously formed so as to form an uneven pattern in a chemical liquid layer 510 (refer to FIG. 8B) of a display substrate 505 (refer to FIG. 8B).

The reference end 141 may be connected to one of the edges of the film loading chuck 110 in the first direction X, e.g., one end in the second direction Y. The aligner 143 may be disposed adjacent to the other of the edges of the film loading chuck 110 in the first direction X. The aligner 143 may be connected to the alignment ruler driver 145 connected to the film loading chuck 110. The aligner 143 may be moved in the second direction Y by the alignment ruler driver 145.

The film fixer 130 may be provided on the film loading chuck 110. The film fixer 130 may be moved in the third direction Z by a driver.

Referring to FIGS. 2 and 3A, the imprint film IF may be provided on the film loading stage 1. The imprint film IF may correspond to the mold of the imprinting process described above. In an implementation, the process surface of the imprint film IF may include a fine uneven pattern. The protection film PF may be (e.g., previously) provided on the process surface of the imprint film IF so that the fine uneven pattern may be prevented from being contaminated by fine particles of the process surface of the imprint film IF or being damaged due to an external shock. Accordingly, the protection film PF may be separated before the imprint film IF is loaded onto the film frame 200 (refer to FIG. 5A) as described below.

The film loading chuck 110 may be configured to levitate the imprint film IF and the protection film PF (on the film loading chuck 110). In an implementation, the the film loading chuck 110 may contact the protection film PF and support the protection film PF and the imprint film IF. A structure of the film loading chuck 110 will be described below in further detail.

As described below, the film fixer 130 may stably fix the imprint film IF after aligning the imprint film IF with the film frame 200 (refer to FIG. 5A). In an implementation, the film fixer 130 may be, e.g., pneumatic.

The protection film separator 120 may include an adhesive roll 121 and a mold 126. A surface of the adhesive roll 121 may be adhesive. The surface of the adhesive roll 121 may have a sufficiently strong adhesive force so that the protection film PF that contacts the adhesive roll 121 may adhere to the adhesive roll 121. The adhesive roll 121 may be, e.g., cylindrical, and a cross-sectional profile thereof may be circular. When the cross-sectional profile of the adhesive roll 121 is circular, a radius of the adhesive roll 121 may be about 20 mm or less. In an implementation, the cross-sectional profile of the adhesive roll 121 may have various curved profiles and/or polygonal profiles.

The mold 126 may be disposed over the adhesive roll 121 and may be configured to be movable in the third direction Z. In an implementation, the film loading chuck 110, the adhesive roll 121, and the film fixer 130 may be configured to be movable in the third direction Z. The adhesive roll 121 and the mold 126 may be configured to move relative to each other in the third direction Z. In an implementation, a portion of the mold 126 may have a profile corresponding to the adhesive roll 121. In an implementation, a surface of the mold 126 facing the adhesive roll 121 may have a profile that is able to be engaged with (e.g., complementary to) the surface of the adhesive roll 121. For example, when the cross-sectional profile of the adhesive roll 121 is circular, a portion of a cross-sectional profile of the mold 126 may correspond or be complementary thereto and include an arc. When the cross-sectional profile of the adhesive roll 121 has various curved profiles and/or polygonal profiles, a portion of the cross-sectional profile of the mold 126 may correspond or be complementary thereto and have various curved profiles and/or polygonal profiles. A separation method of the protection film PF using the adhesive roll 121 and the mold 126 will be described below in detail.

Referring to FIGS. 2 and 3B, a protection film separator 120' according to some embodiments may include an adhesive roll 121' and a mold 126'. The adhesive roll 121' may be configured to be movable in the first direction X from one end of the protection film PF to the other end thereof. In an implementation, the mold 126' that has a flat form may be provided.

Referring to FIGS. 2 and 4, the imprint film IF (from which the protection film PF (refer to FIG. 3A) has been separated) may be provided on the film loading chuck 110. In an implementation, the film loading chuck 110 may include a plurality of gas outlets arranged in rows and columns. Gases emitted upwards through the gas outlets may allow the imprint film IF to levitate or hover above the upper surface of the film loading chuck 110, e.g., due to the pressure of a cushion of gas. Accordingly, the imprint film IF may be spaced apart from the film loading chuck 110 and thus may not contact the upper surface of the film loading chuck 110.

The reference end 141 may be connected to one end of the film loading chuck 110 in the second direction Y. The reference end 141 may have a stick shape extending in the first direction X, and an upper surface of the reference end 141 may be higher than the upper surface of the film loading chuck 110. A surface of the reference end 141 contacting the film loading chuck 110 may be substantially vertical to the upper surface of the film loading chuck 110.

The aligner 143 may be connected to the other end of the film loading chuck 110 in the second direction Y. The aligner 143 and the reference end 141 may be spaced apart from each other with the film loading chuck 110 therebetween. The aligner 143 may have a stick shape extending in the first direction X, and an upper surface of the reference end 141 may be higher than the upper surface of the film loading chuck 110. A level of an upper surface of the aligner 143 may be substantially the same as that of the upper surface of the reference end 141.

The alignment ruler driver 145 may be connected to the film loading chuck 110 and the alignment ruler 143. The alignment ruler driver 145 may be configured to be movable in the second direction Y, and thus, the aligner 143 may also move according to movement of the alignment ruler driver 145. In an implementation, the alignment ruler driver 145 may include a motor-type driver, a pneumatic driver, a ball screw driver, or the like. The alignment ruler driver 145 may be inserted into the film loading chuck 110 as the alignment ruler driver 145 moves in the second direction Y. Thus, a surface of the aligner 143 may contact the film loading chuck 110.

Figure 5A:
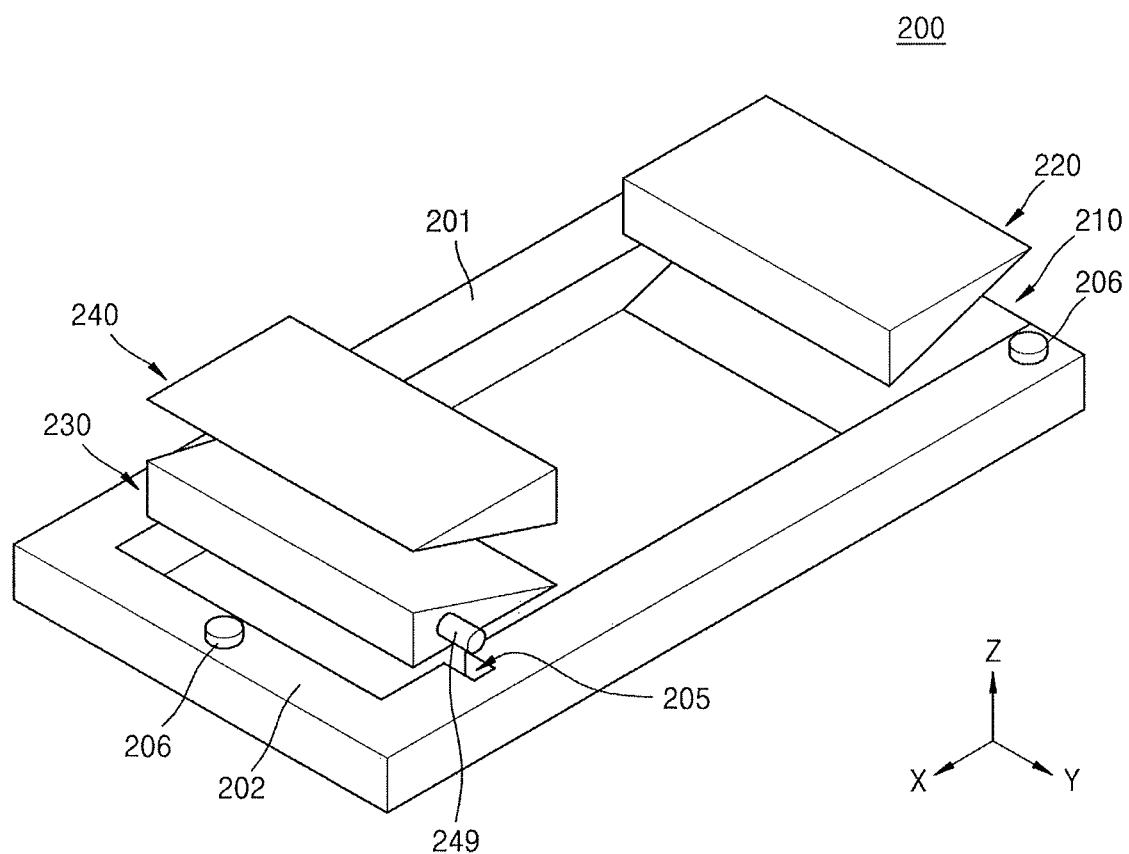
FIG. 5A illustrates an exploded perspective view of a film frame according to some embodiments.
Figure 5B:
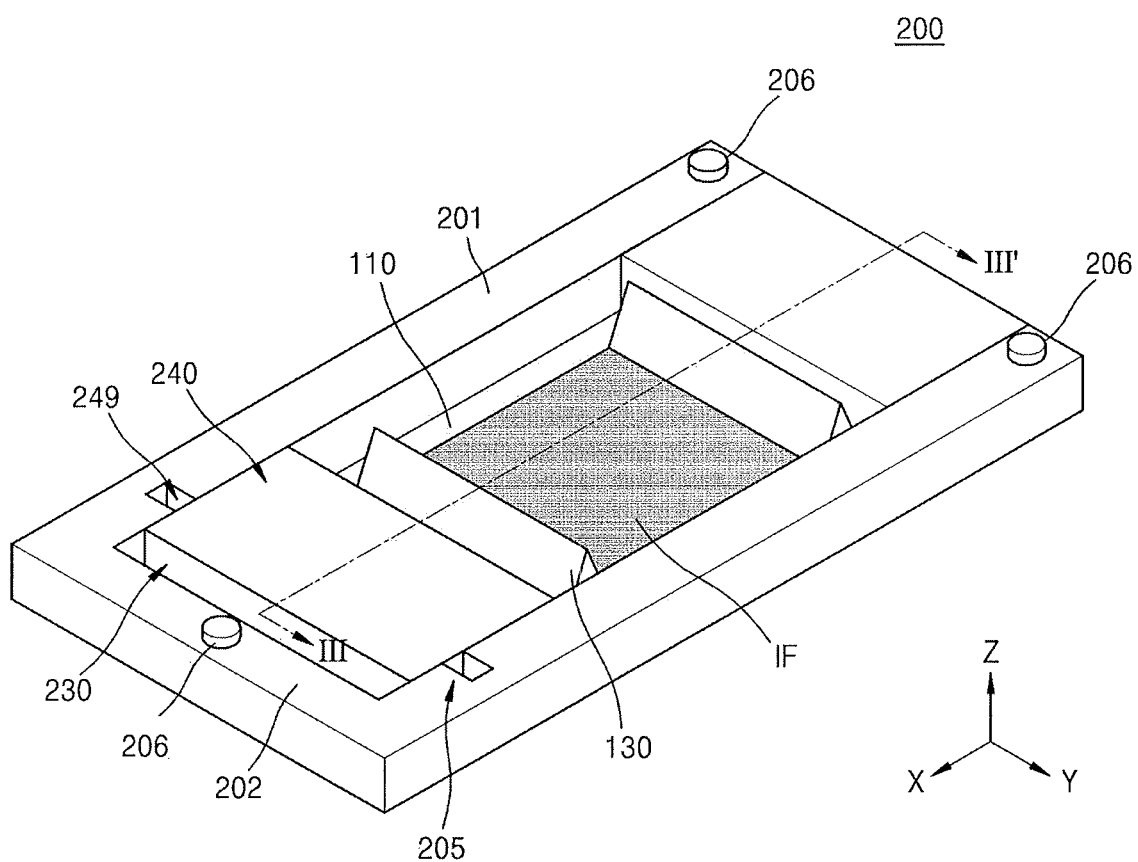
FIG. 5B illustrates a perspective view of a film frame according to some embodiments.
Figure 5C:
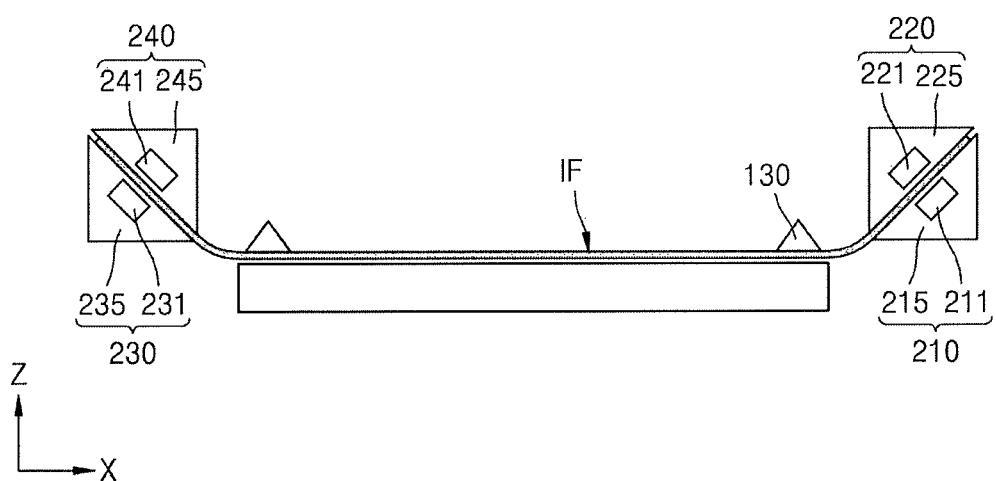
FIG. 5C illustrates a cross-sectional view taken along a line III-III' of FIG. 5B.

FIG. 5A illustrates an exploded perspective view of the film frame 200 according to some embodiments. FIG. 5B illustrates a perspective view of the film frame 200 according to some embodiments. FIG. 5C illustrates a cross-sectional view taken along a line III-III' of FIG. 5B.

Referring to FIGS. 5A to 5C, the film frame 200 may include a pair of first frame edges 201 and a second frame edge 202 connected between ends of the pair of first frame edges 201. The pair of first frame edges 201 and the second frame edge 202 may have a stick shape extending in a predetermined direction. Each of the first frame edges 201 may include a free end combination groove 205 adjacent to the second frame edge 202. The free end combination groove 205 may have a predetermined size and shape so that free end shafts 249 (refer to FIG. 5A) as described below may be inserted therein. When the film frame 200 is disposed on the film loading chuck 110, the first frame edges 201 may extend substantially parallel to the first direction X, and the second frame edge 202 may extend substantially parallel to the second direction Y. Hereinafter, when referring to a direction, the direction will be described as being the same as the direction defined in FIGS. 2, 3A, and 3B based on a direction when the film frame 200 is disposed on the film loading chuck 110.

In an implementation, the film frame 200 may include a plurality of transportation robot combiners 206 protruding from an upper surface of the film frame 200. The plurality of transportation robot combiners 206 are configured to facilitate combining a transportation robot with the film frame 200. Some of the plurality of transportation robot combiners 206 may be disposed at the other ends of the first frame edges 201, e.g., ends of the first frame edges 201 spaced apart from or distal to the second frame edge 202. The other of the plurality of transportation robot combiners 206 may be disposed at a center of the second frame edge 202 in the second direction Y. In an implementation, as illustrated in FIGS. 5A and 5B, three transportation robot combiners 206 may be provided. In an implementation, one or more transportation robot combiners may be provided. In an implementation, suitable shapes and arrangement may be selected for the transportation robot combiners 206.

A first magnetic fixer 210 may be disposed between the other ends of the pair of first frame edges 201. For example, the first magnetic fixer 210 may be disposed between the ends of the first frame edges 201 spaced apart from or distal to the second frame edge 202. The first magnetic fixer 210 may be connected to the first frame edges 201. A second magnetic fixer 220 may be disposed on the first magnetic fixer 210. The second magnetic fixer 220 may be magnetically combined with the first magnetic fixer 210. The second magnetic fixer 220 may be moved relative to the first magnetic fixer 210 by a driver. The first and second magnetic fixers 210 and 220 may extend lengthwise in the second direction Y. The first and second magnetic fixer 210 and 220 may configure or form a fixed end clamp.

A third magnetic fixer 230 may be combined with or separated from the first frame edges 201 (e.g., may be detachably attached). The third magnetic fixer 230 may include free end shafts 249. When the third magnetic fixer 230 is combined with the first frame edges 201, the free end shafts 249 may be inserted into the free end combination groove 205. In an implementation, the free end shafts 249 may have, e.g., a stick shape or cylinder shape protruding from the third magnetic fixer 230 in the second direction Y. When the third magnetic fixer 230 is combined with the first frame edges 201, the third magnetic fixer 230 may be disposed at a predetermined location adjacent to the second frame edge 202. A fourth magnetic fixer 240 may be disposed on the third magnetic fixer 230. The fourth magnetic fixer 240 may be magnetically combined with the third magnetic fixer 230. The fourth magnetic fixer 240 may be connected to a driver so that the fourth magnetic fixer 240 is movable relative to the third magnetic fixer 230. The third and fourth magnetic fixers 230 and 240 may extend lengthwise in the second direction Y. The third and fourth magnetic fixers 230 and 240 may configure or form a free end clamp. The first magnetic fixer 210 and the third magnetic fixer 230 (combined with the film frame 200) may be sufficiently spaced from each other so that the free end clamp and the fixed end clamp may respectively hold ends (in the first direction X) of the imprint film IF.

Referring to FIGS. 5B and 5C, the film frame 200 may be disposed on the film loading chuck 110. The film frame 200 may be loaded with the imprint film IF. One end of the imprint film IF may be fixed by the fixed end clamp, e.g., the first and second magnetic fixers 210 and 220. The other end of the imprint film IF may be fixed by the free end clamp, e.g., the third and fourth magnetic fixers 230 and 240.

The first magnetic fixer 210 may include a first magnetic device 211 (e.g., a magnetic attractor) and a first cover 215 covering the first magnetic device 211. The second magnetic fixer 220 may include a second magnetic device 221 and a second cover 225 covering the second magnetic device 221. The third magnetic fixer 230 may include a third magnetic device 231 and a third cover 235 covering the third magnetic device 231. The fourth magnetic fixer 240 may include a fourth magnetic device 241 and a fourth cover 245 covering the fourth magnetic device 241.

In an implementation, one of the first and second magnetic devices 211 and 221 may include a magnet, and the other may include one of a magnet and a magnetic material. One of the third and fourth magnetic devices 231 and 241 may include a magnet, and the other may include one of a magnet and a magnetic material. In an implementation, some of the first to fourth magnetic devices 211, 221, 231, and 241 may include an electromagnet or a permanent magnet. Portions of the first to fourth magnetic devices 211, 221, 231, and 241 adjacent to the first to fourth covers 215, 225, 235, and 245 may correspond to a pole different from that of portions spaced apart from the first to fourth covers 215, 225, 235, and 245. For example, when portions of the first to fourth magnetic devices 211, 221, 231, and 241 adjacent to the first to fourth covers 215, 225, 235, and 245 correspond to an N pole, portions spaced apart from the first to fourth covers 215, 225, 235, and 245 may correspond to an S pole, and the case may be reversed. The first to fourth magnetic devices 211, 221, 231, and 241 will be described in detail with reference to FIGS. 7A to 7C. The first and second magnetic devices 211 and 221 may magnetically interact with each other. The first and second magnetic devices 211 and 221 may apply gravity to each other, e.g., may be attracted to each other. Accordingly, the first and second covers 215 and 225 may apply normal force on the imprint film IF while being engaged with each other with the imprint film IF therebetween and thus may fix one end of the imprint film IF. The third and fourth magnetic devices 231 and 241 may magnetically interact with each other. The third and fourth magnetic devices 231 and 241 may apply gravity to each other. Accordingly, the third and fourth covers 235 and 245 may apply normal force on the imprint film IF while being engaged with each other with the imprint film IF therebetween and thus may fix the other end of the imprint film IF. In this regard, a portion of a process surface of the imprint film IF contacting the first and third covers 215 and 235 may correspond to an area where no uneven pattern is formed.

Some fixing methods may include manually manipulating a bolt to fix an imprint film to a film frame. Thus, reliability and reproducibility of fixing of the imprint film could be degraded. According to some embodiments, the free end clamp and the fixed end clamp using magnetic force may be provided, and thus, fixing of the imprint film IF at a uniform force may be provided, and reliability of fixing may be increased. Also, as a strong fixing force is used, wrinkles of the imprint film IF may be minimized, and the imprint film IF may be prevented from slipping due to tension on the imprint film IF during processes.

Figure 6A:
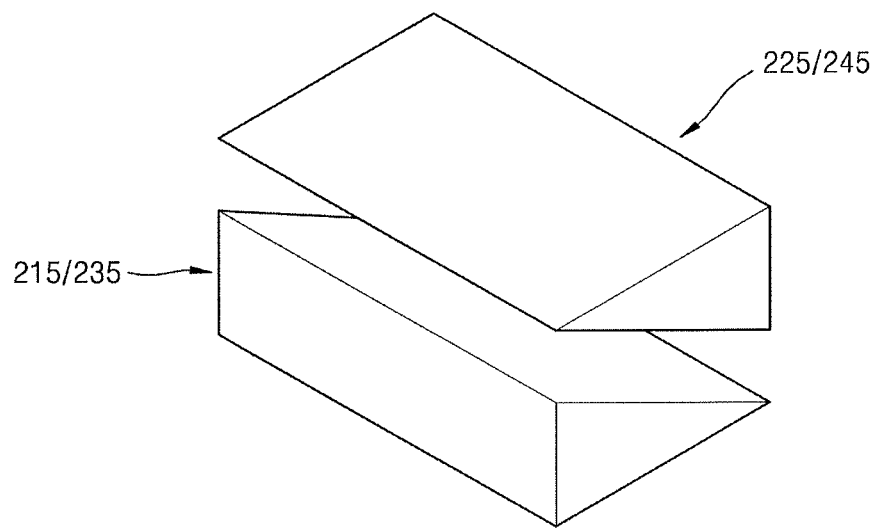
FIGS. 6A to 6C illustrate perspective views of a film frame according to some embodiments.
Figure 6B:
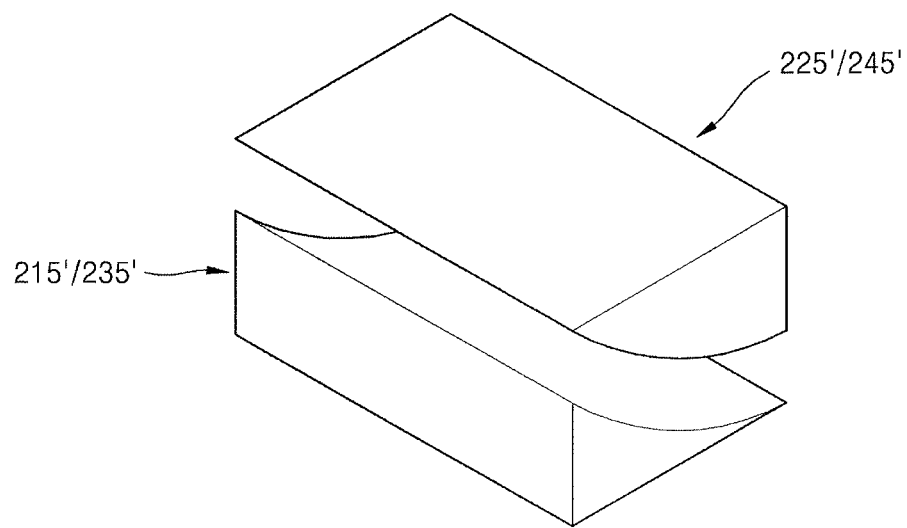
Figure 6C:
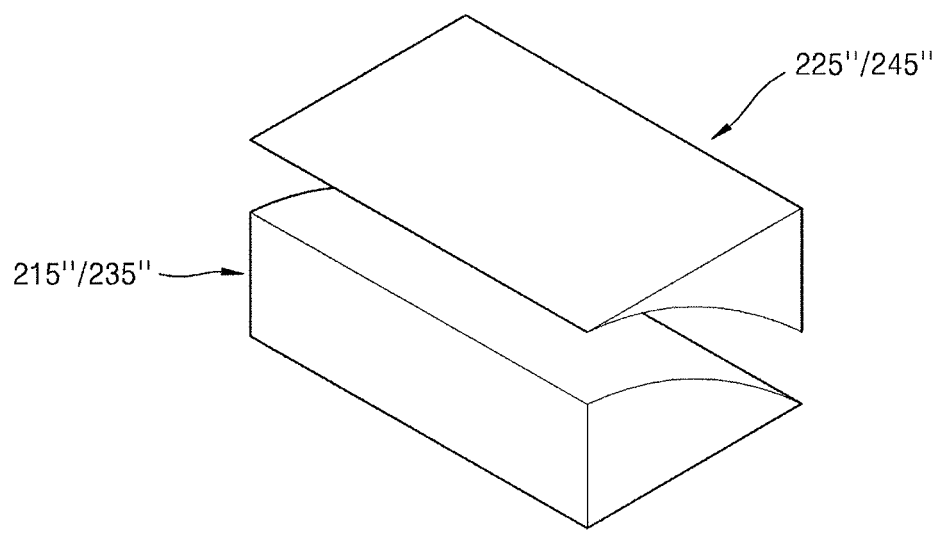

FIGS. 6A to 6C illustrate perspective views of first to fourth covers 210, 220, 230, and 240 (see FIG. 5C) included in a film frame, according to some embodiments.

Referring to FIG. 6A, the first and second covers 215 and 225 may respectively have opposite surfaces configured to be engaged with each other, and the third and fourth covers 235 and 245 may respectively have opposite surfaces configured to be engaged with each other. In an implementation, the first to fourth covers 215, 225, 235, and 245 may include inclined surfaces. Inclined surfaces of the first and third covers 215 and 235 may face each other.

The first to fourth covers 215, 225, 235, and 245 may have a right triangular prism shape. A horizontal cross-sectional area of the first and third covers 215 and 235, e.g., a cross-sectional area that is horizontal to the first and second directions X and Y, may increase in a downward direction. A horizontal cross-sectional area of the first to fourth covers 215, 225, 235, and 245 may continuously change in the third direction Z. In an implementation, a horizontal cross-sectional area of a portion spaced apart from the bottom of the first to fourth covers 215, 225, 235, and 245 may discontinuously change in the third direction Z. In this regard, the downward direction may correspond to, when the film frame 200 is disposed on the film loading chuck 110 (see FIG. 4), a direction toward the film frame 200 in the third direction Z.

Referring to FIG. 6B, unlike FIG. 6A, surfaces of first and second covers 215' and 225' facing each other and surfaces of third and fourth covers 235' and 245' facing each other may correspond to or have curved surfaces. In an implementation, surfaces of the first and third covers 215' and 235' facing the second and fourth covers 225' and 245' may correspond to or have concave surfaces. Surfaces of the second and fourth covers 225' and 245' facing the first and third covers 215' and 235' may correspond to or have convex surfaces.

Referring to FIG. 6C, according to some embodiments, surfaces of first and third covers 215" and 235" facing second and fourth covers 225" and 245" may correspond to or have convex surfaces. Surfaces of the second and fourth covers 225" and 245" facing the first and third covers 215" and 235" may correspond to or have concave surfaces. In an implementation, opposite surfaces of the first to fourth covers may have any appropriate or suitable shape.

Figure 7C:
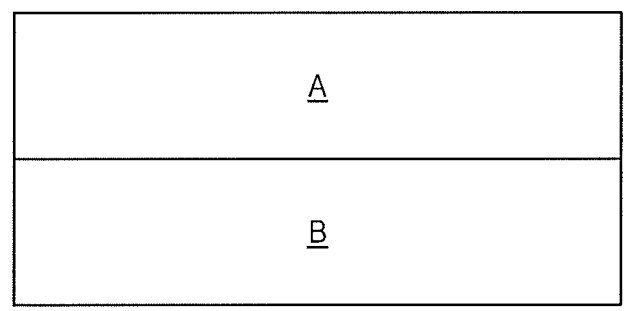

FIGS. 7A to 7C are cross-sectional views of first to fourth magnetic devices according to some embodiments.

Referring to FIG. 7A, when the first to fourth magnetic devices correspond to or include magnets, the first to fourth magnetic devices 211, 221, 231, and 241 may include a plurality of arranged magnets. The magnets may include a first pole A and a second pole B. The first pole A and the second pole B may correspond to different poles from each other. For example, when the first pole A corresponds to an N pole, the second pole B may correspond to an S pole. When the first pole A corresponds to an S pole, the second pole B may correspond to an N pole. In an implementation, two poles arranged vertically in the drawing may constitute one magnet. In an implementation, at least some of the first to fourth magnetic devices 211, 221, 231, and 241 may include a plurality of magnets of polarities having pole directions alternately arranged in the second direction Y. For example, when a polarity of one end of a magnet disposed at one end in the second direction Y is the first pole A, a polarity of an adjacent end of an adjacent magnet may be the second pole B. In an implementation, as illustrated in FIG. 7A, a plurality of magnets may be continuously formed (e.g., directly adjacent). In an implementation, the plurality of magnets may be spaced apart from each other by a predetermined distance.

In an implementation, magnetic devices may include a plurality of magnets arranged in the second direction Y, and a force for fixing an imprint film may depend on the arrangement of the plurality of magnets. In an implementation, when the plurality of magnets that are alternately arranged in the second direction Y are provided, the fixing force may be about twice or greater compared to when poles of the same polarity are adjacently arranged.

In an implementation, as shown in FIG. 7B, first to fourth magnetic devices 211',221',231', and 241' may include a plurality of magnets having poles of the same polarity adjacently arranged, or as shown in FIG. 7C, first to fourth magnetic devices 211",221",231", and 241" may include one continuous magnet.

Figure 8A:
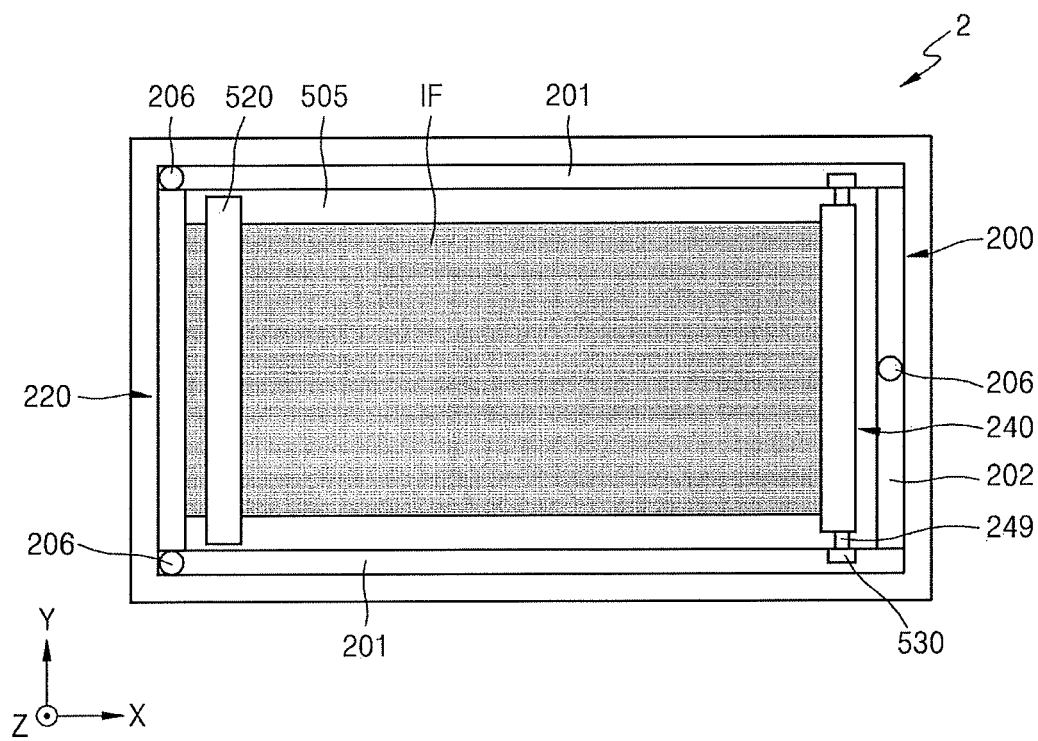
FIGS. 8A and 8B illustrate plan views of an imprint stage according to some embodiments.
Figure 8B:
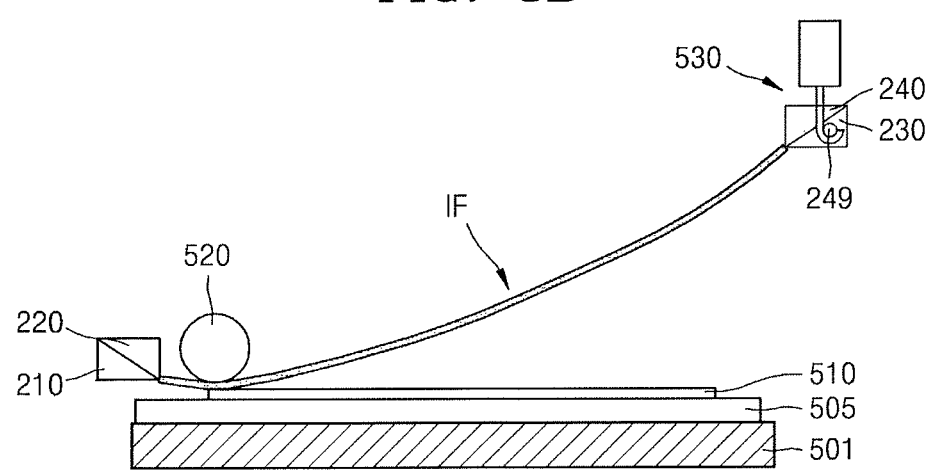

FIG. 8A illustrates a plan view of the imprint stage 2 and the film frame 200 disposed on the imprint stage 2. FIG. 8B illustrates a side plan view thereof.

Referring to FIGS. 8A and 8B, the imprint stage 2 may include an imprint chuck 501, the display substrate 505 on which a chemical liquid layer 510 is provided, a press 520, and a free end hook 530. The film frame 200 loaded with the imprint film IF may be provided to the imprint stage 2. As described above, a transportation robot may transport the film frame 200 loaded with the imprint film IF from the film loading stage 1 (refer to FIG. 1) to the imprint stage 2.

The chemical liquid layer 510 may correspond to or be a photocurable resin in which a curing reaction proceeds for a very short time when light having high energy (e.g., several mW/cm² to hundreds of mW/cm²) in a certain wavelength range, e.g., ultraviolet rays, is irradiated. The chemical liquid layer 510 may be, e.g., a photocurable acrylic resin, a photocurable vinyl ether-based resin, etc.

The press 520 may press the imprint film IF against the chemical liquid layer 510 on the display substrate 505, thereby transferring a fine uneven pattern from the imprint film IF to the chemical liquid layer 510. The press 520 may correspond to or be, e.g., a pressing roller for pressing the imprint film IF against the display substrate 505.

During a pressing process, a fixed end clamp composed of the first and second magnetic fixers 210 and 220 may be maintained at a predetermined location. A free end clamp composed of the third and fourth magnetic fixers 230 and 240 may move along a predetermined path. The free end shaft 249 of the third magnetic fixer 230 may be combined with the free end hook 530. As the free end hook 530 is moved along a predetermined path by a driver, the free end clamp may also move.

While the imprint film IF is pressed against the display substrate 505, light (e.g., ultraviolet rays) emitted from a light source may be irradiated to the chemical liquid layer 510, and thus, a curing process may proceed. Accordingly, an uneven pattern corresponding to the imprint film IF may be formed on the display substrate 505.

Figure 9:
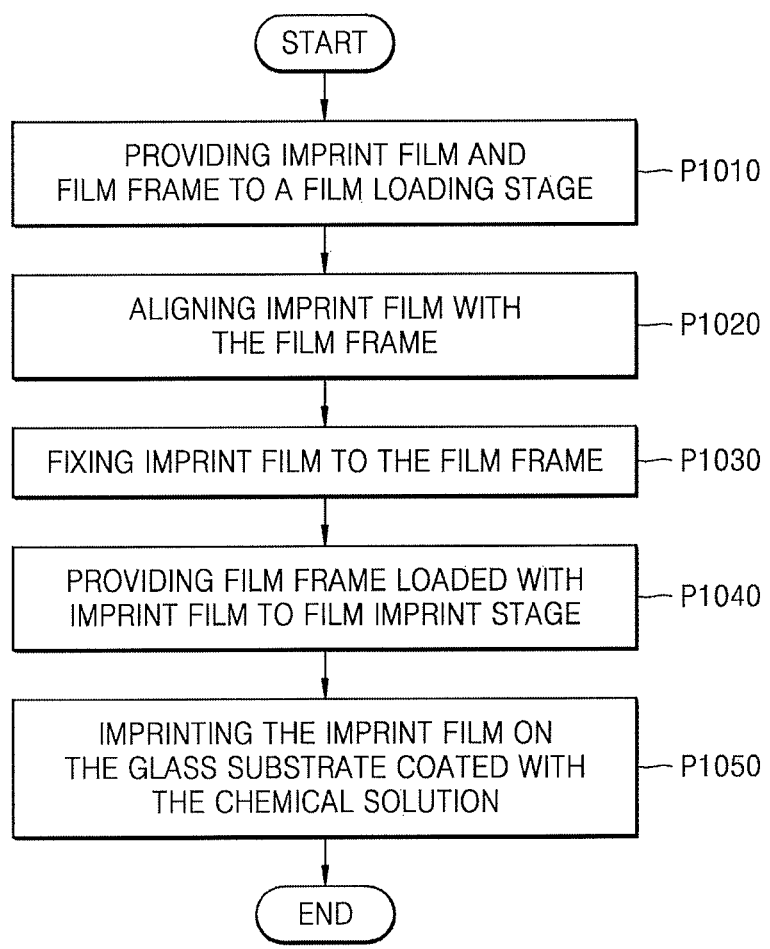
FIG. 9 illustrates a flowchart of a method of manufacturing a display substrate, according to some embodiments.

FIG. 9 illustrates a flowchart of a method of manufacturing a display substrate, according to some embodiments.

Referring to FIGS. 1, 3A, and 9, in process P1010, the imprint film IF and the film frame 200 may be provided to the film loading stage 1.

As described above, the protection film PF (for protecting a process surface of the imprint film IF) may be attached onto the process surface of the imprint film IF, and accordingly, the protection film PF may be separated therefrom before the imprint film IF is mounted to the film frame 200 (refer to FIG. 5A).

Referring to FIG. 3A, the mold 126 may be moved relative to the adhesive roll 121 to separate the protection film PF. The mold 126 may be moved relative to the adhesive roll 121 in the third direction Z so as to engage the mold 126 and the adhesive roll 121 with each other with the protection film PF and the imprint film IF therebetween. Next, when the mold 126 is spaced apart from the imprint film IF, an adhesive force acts between the protection film PF and the adhesive roll 121, and an elastic restoring force acts on the imprint film IF, and thus, the protection film PF may be separated from the imprint film IF. Accordingly, separation of a protection film may be easily automated without a separate vacuum apparatus for supporting the imprint film IF or an additional driving apparatus for the adhesive roll 121.

Referring to FIG. 3B, unlike FIG. 3A, the adhesive rolls 121 may be provided at ends of the protection film PF contacting the protection film PF and then may move to the other ends in the first direction X. Accordingly, the protection film PF may be sequentially attached to the adhesive roll 121 by an adhesive force of the adhesive roll 121. In this regard, an elastic restoring force acts on the imprint film IF deformed together with the protection film PF, and thus, the imprint film IF may be separated from the protection film PF.

Figure 3C:
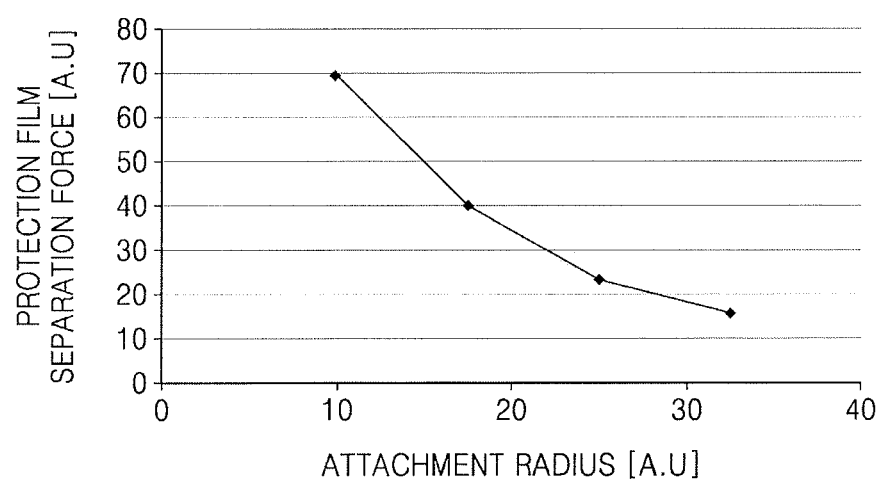
FIG. 3C illustrates a graph for describing protection film separation according to some embodiments.

FIG. 3C illustrates a graph for describing the protection film separation according to exemplary embodiments. FIG. 3C shows a separation force according to a radius of the adhesive roll 121 (refer to FIG. 3A) having a cylinder shape. Units of the horizontal axis and the vertical axis of the graph are shown as each having an arbitrary unit. As the radius of the adhesive roll 121 (refer to FIG. 3A) decreases, the separation force may increase. In an implementation, in a case of the protection film PF having a separation force of about 30 (e.g., mN/mm) as the arbitrary unit, when a mold having a radius of about 20 (e.g., mm) as the arbitrary unit is used, the imprint film IF and the protection film PF may be separated from each other.

Referring to FIGS. 1, 4, and 9, in process P1020, the imprint film IF may be aligned with the film frame 200. Aligning the imprint film IF with the film frame 200 may be performed through aligning the imprint film IF with the reference end 141.

The imprint film IF from which the protection film PF (refer to FIG. 3A) has been separated may be levitated by gases emitted from a gas outlet formed in the film loading chuck 110. Thus, a process surface of the imprint film IF may be spaced apart from an upper surface of the film loading chuck 110, and may be protected from contact with a contamination source. As described above, the aligner 143 may be driven by the alignment ruler driver 145 to align the imprint film IF with the reference end 141.

In some other cases, imprint film alignment may be manually performed by an operator. Accordingly, the imprint film alignment could experience, e.g., occurrence of static electricity due to friction with a chuck and/or particle contamination due to contact with the chuck. According to some embodiments, alignment may be performed while the imprint film IF is not in contact with the film loading chuck 110, and thus, occurrence of contact contamination particles due to friction, frictional static electricity, and exfoliative static electricity may be prevented. Also, a frictional force with the film loading chuck 110 is close to 0, and thus, the imprint film IF may be aligned easily with a small strength. The aligned imprint film IF may be fixed by the film fixer 130 (refer to FIG. 2) while being levitated.

Next, referring to FIGS. 5B, 5C, and 9, in process P1030, the imprint film IF may be fixed to the film frame 200 by using the method described with reference to FIGS. 5B and 5C.

Next, referring to FIGS. 1 and 9, in process P1040, the film frame 200 loaded with the imprint film IF disposed at the film loading stage 1 may be transported to the imprint stage 2 by a transportation robot.

Next, referring to FIGS. 8A, 8B, and 9, in process P1050, the imprint film IF may be imprinted on the display substrate 505 by using the method described with reference to FIGS. 8A and 8B.

In a large-scale imprinting process, sequential contact between a mold and a substrate may be made for uniform transfer of a nano-class pattern, and to this end, alignment and loading technology of a large-scale film may be an important factor that determines process performance. A series of sequential processes from feeding of an imprint to cutting, transportation/fixing, alignment, and fixing may be performed manually by an operator. Accordingly, there may be difficulty in process influence factor control because of degradation of operation reproducibility. Also, occurrence of static electricity due to contact and/or friction that occur during a process of fixing and aligning an imprint film after transporting the imprint film, the possibility of external contamination by the operator, and difficulty in controlling tact time could occur. According to some embodiments, process reproducibility and mass production may be obtained by implementing an automation method and apparatus of a film loading process at imprinting facilities.

The embodiments may provide a film frame in which an imprint film is loaded.

The embodiments may provide increased manufacturing efficiency and reliability of a display substrate by automating a process of manufacturing the display substrate.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A film frame configured to be loaded with an imprint film, the film frame comprising:
    a pair of frame edges extending lengthwise in a first direction and arranged opposite to each other;
    a fixed end clamp connected to the pair of frame edges and extending lengthwise in a second direction perpendicular to the first direction; and
    a free end clamp between the pair of frame edges, the free end clamp extending lengthwise in the second direction and configured to be detachably coupled with the pair of frame edges,
    wherein:
    the fixed end clamp includes a first magnetic fixer extending lengthwise in the second direction and a second magnetic fixer on the first magnetic fixer,
    the free end clamp includes a third magnetic fixer extending lengthwise in the second direction and a fourth magnetic fixer on the third magnetic fixer,
    the first and second magnetic fixers are configured apply normal contact force on a first end of the imprint film to fix the first end of the imprint film,
    the third and fourth magnetic fixers are configured apply normal contact force on a second end of the imprint film opposite to the first end of the imprint film to fix the second end of the imprint film,
    the first magnetic fixer includes a first magnetic device and a first cover covering the first magnetic device,
    the second magnetic fixer includes a second magnetic device and a second cover covering the second magnetic device,
    the third magnetic fixer includes a third magnetic device and a third cover covering the third magnetic device,
    the fourth magnetic fixer includes a fourth magnetic device and a fourth cover covering the fourth magnetic device,
    the first cover and the second cover respectively have complementary opposite surfaces,
    the third cover and the fourth cover respectively have complementary opposite surfaces, and
    cross-sectional areas of the first cover and the third cover increase in a third direction orthogonal to the first and second directions.

2. The film frame as claimed in claim 1, wherein:
    the pair of frame edges includes a free end combination groove depressed from an upper surface of the frame edges, and
    the third magnetic fixer includes a free end shaft protruding in the second direction.

3. The film frame as claimed in claim 1, wherein:
    one of the first and second magnetic devices includes a magnet, and the other includes one of a magnetic material and a magnet, and
    one of the third and fourth magnetic devices includes a magnet, and the other includes one of a magnetic material and a magnet.

4. The film frame as claimed in claim 1, wherein at least one of the first to fourth magnetic devices includes a plurality of magnets having pole directions alternately arranged in the second direction.

5. The film frame as claimed in claim 1, wherein the first and third covers have inclined surfaces facing each other.

6. The film frame as claimed in claim 1, wherein cross-sectional areas of the first to fourth covers horizontal continuously change with respect to the first and second directions.

7. A system for manufacturing a display substrate, the system comprising:
    a film loading stage;
    the film frame as claimed in claim 1 at the film loading stage;
    an imprint stage configured to perform an imprinting process on the display substrate by using the imprint film; and
    a transporter configured to move the film frame between the film loading stage and the imprint stage,
    wherein the film loading stage includes:
    a flat film loading chuck having at least two pairs of opposite edges; and
    an adhesive roll and a mold adjacent to first edges which are one pair of the at least two pairs of opposite edges of the film loading chuck.

8. The system as claimed in claim 7, wherein the film loading chuck includes:
    second edges, which are one pair of the at least two pairs of opposite edges of the film loading chuck, the second edges being different from the first edges;
    a reference end connected to one of the second edges;
    an alignment ruler driver connected to the other one of the second edges; and
    an alignment ruler connected to the alignment ruler driver,
    wherein the film loading chuck includes a plurality of gas outlets and is configured to cause the imprint film that is disposed on the film loading chuck to float and be spaced apart from the film loading chuck.

9. The system as claimed in claim 7, wherein the adhesive roll and the mold have complementary profiles.

10. The system as claimed in claim 7, wherein the adhesive roll is cylindrical.

11. The system as claimed in claim 7, wherein:
    at least one of the first to fourth magnetic devices a plurality of magnets having pole directions alternately arranged in the second direction.

12. A method of manufacturing a display substrate, the method comprising:
    providing the film frame as claimed in claim 1 to a film loading stage;
    providing an imprint film to the film loading stage;
    aligning the imprint film with the film frame;
    fixing the imprint film to the film frame; and
    imprinting the imprint film on the display substrate,
    wherein providing the imprint film includes separating a protection film from the imprint film by using an elastic force.

13. The method as claimed in claim 12, wherein aligning the imprint film with the film frame includes:

providing the imprint film onto a film loading chuck of the film loading stage;

causing the imprint film to float above the film loading chuck; and aligning the imprint film with a reference end that is on the film loading chuck.

14. The method as claimed in claim 12, wherein fixing the imprint film to the film frame includes:

disposing at least one portion of the imprint film at the free end clamp and the fixed end clamp of the film frame; and fixing the at least one portion of the imprint film by applying a magnetic force to the free end clamp and the fixed end clamp.

15. The method as claimed in claim 12, wherein separating the protection film from the imprint film includes:

attaching the protection film and an adhesive roll to each other; and elastically deforming the protection film and the imprint film.

16. The method as claimed in claim 15, wherein:

the adhesive roll has a predetermined profile, and elastically deforming the protection film and the imprint film includes:

providing the imprint film between the adhesive roll and a mold having a profile complementary to the profile of the adhesive roll; and causing the adhesive roll and the mold to approach each other so that the adhesive roll and the mold are engaged with each other with the imprint film therebetween.

17. The method as claimed in claim 15, wherein:

attaching the protection film and the adhesive roll to each other includes attaching the adhesive roll to one end of the protection film, and elastically deforming the protection film and the imprint film includes moving the attached adhesive roll from the one end of the protection film to the other end thereof.

* * * * *